United States Patent
Muramatsu

Patent Number: 5,927,263
Date of Patent: Jul. 27, 1999

[54] METHOD FOR MANUFACTURING COMPLETELY CIRCULAR SEMICONDUCTOR WAFERS

[75] Inventor: Satoru Muramatsu, Tokyo, Japan

[73] Assignee: NEC Corporation, Tokyo, Japan

[21] Appl. No.: 08/966,060

[22] Filed: Nov. 7, 1997

Related U.S. Application Data

[62] Division of application No. 08/739,891, Oct. 31, 1996, Pat. No. 5,716,876.

[30] Foreign Application Priority Data

Oct. 31, 1995 [JP] Japan .................................. 7-282873

[51] Int. Cl.⁶ ....................................................... B28D 1/04
[52] U.S. Cl. ...................................... 125/13.02; 125/13.01
[58] Field of Search ............................. 438/14, 460, 400, 438/386, 409; 125/13.02, 12, 13.01, 15, 16.01, 16.02, 18, 21, 23.02, 23.01; 451/551, 6, 5

[56] References Cited

U.S. PATENT DOCUMENTS

| | | | |
|---|---|---|---|
| 3,838,678 | 10/1974 | Kumada et al. | 125/13.02 |
| 4,227,348 | 10/1980 | Demers | 451/41 |
| 4,420,909 | 12/1983 | Steere, Jr. | 125/13.02 |
| 4,971,021 | 11/1990 | Kubotera et al. | 125/13.02 |
| 5,201,305 | 4/1993 | Takeuchi | 125/16.01 |
| 5,287,843 | 2/1994 | Katayama et al. | 125/13.02 |
| 5,313,741 | 5/1994 | Toyama | 125/13.02 |
| 5,383,444 | 1/1995 | Kimura | 125/13.02 |
| 5,458,526 | 10/1995 | Tsukada et al. | 451/5 |
| 5,667,423 | 9/1997 | Itoi | 125/13.02 |
| 5,681,204 | 10/1997 | Kawaguchi et al. | 125/13.02 |
| 5,716,876 | 2/1998 | Muramatsu | 438/14 |

FOREIGN PATENT DOCUMENTS

| | | | |
|---|---|---|---|
| 6241145 | 3/1987 | Japan | G03F 1/00 |
| 653100 | 2/1994 | Japan | H01L 21/02 |

*Primary Examiner*—David A. Scherbel
*Assistant Examiner*—Derris Holt Banks
*Attorney, Agent, or Firm*—Hayes Soloway Hennessey Grossman & Hage PC

[57] ABSTRACT

In a method for manufacturing completely circular wafers, a specified crystal orientation of a cylindrical semiconductor crystal member is detected, and a support is mounted on the semiconductor crystal member in accordance with the detected specified crystal orientation. Then, a recognition mark is marked on a top face of the semiconductor crystal member in accordance with a position of the support. Then, the semiconductor crystal member and the support are cut to form a semiconductor wafer and a support piece. Finally, the semiconductor wafer is separated from the support piece.

27 Claims, 14 Drawing Sheets

21

22

23

24

91

92

93

94

95

5,927,263

METHOD FOR MANUFACTURING COMPLETELY CIRCULAR SEMICONDUCTOR WAFERS

This is a divisional of application(s) Ser. No. 08/739,891 filed on Oct. 31, 1996 now U.S. Pat. No. 5,716,876.

BACKGROUND OF THE INVENTION

1. Field of the Invention

The present invention relates to a method for manufacturing a plurality of completely circular semiconductor substrates (wafers).

2. Description of the Related Art

Generally, in order to specify a crystal orientation of a semiconductor wafer, an orientation flat or a notch is provided. This will be explained later, in detail. Such a wafer is, however, not completely circular due to the presence of the orientation flat or notch. As a result, manufacturing yield is reduced.

In order to increase manufacturing yield, completely circular semiconductor wafers have been adopted (see: JP-A-2-34906 & JP-A-5-13290).

In a prior art method for manufacturing completely circular semiconductor wafers, first, a crystal orientation of each of the wafers is determined by a X-ray diffraction method or the like. Then, each of the wafers is mounted on a laser marking apparatus or the like, thus forming a recognition mark on each of the wafers. Therefore, the number of steps required for determination of crystal orientation is remarkably increased which increases the manufacturing cost. This will also be explained later, in detail.

SUMMARY OF THE INVENTION

It is an object of the present invention to reduce the manufacturing cost of completely circular semiconductor wafers.

According to the present invention, in a method for manufacturing completely circular wafers, a specified crystal orientation of a cylindrical semiconductor crystal member is detected, and a support is mounted on the semiconductor crystal member in accordance with the detected specified crystal orientation. Then, a recognition mark is marked on a top face of the semiconductor crystal member in accordance with a position of the support. Then, the semiconductor crystal member and the support are cut to form a semiconductor wafer and a support piece. Finally, the semiconductor wafer is separated from the support piece. Thus, since only one detection of crystal orientation is performed upon the semiconductor crystal member, the manufacturing cost can be remarkably reduced.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art semiconductor substrate manufacturing apparatuses will be explained with reference to FIGS. 1A, 1B, 2A, 2B, 2C, 2D and 3.

Figure 1A:
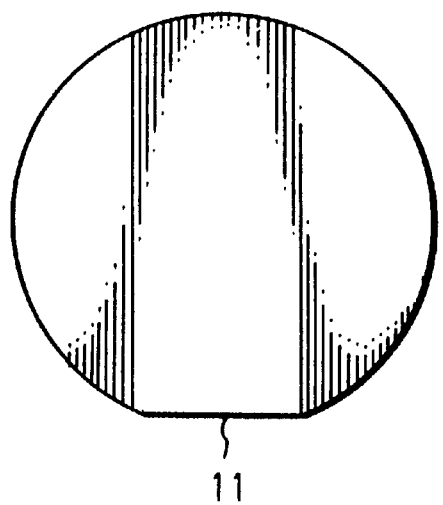
FIGS. 1A, 1B, 2A, 2B, 2C, and 2D are plan views illustrating prior art semiconductor substrates (wafers)
Figure 1B:
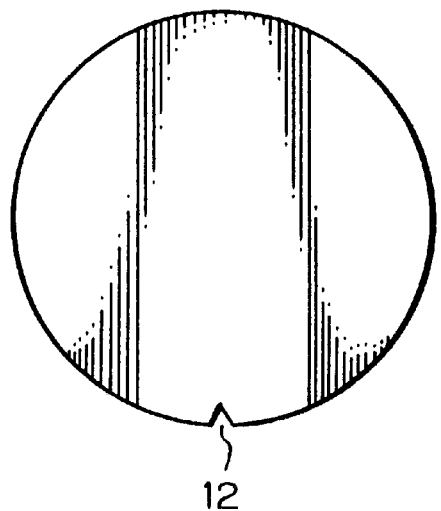

FIGS. 1A and 1B are plan views illustrating prior art semiconductor substrates (wafers). As illustrated in FIG. 1A, a circular semiconductor wafer has an orientation flat 11 at an end thereof for defining a crystal orientation of the wafer. Also, as illustrated in FIG. 1B, a circular semiconductor wafer has a notch 12 at an end thereof for defining a crystal orientation of the wafer.

The wafers of FIGS. 1A and 1B are, however, not completely circular due to the presence of the orientation flat 11 or the notch 12. As a result, the manufacturing yield is reduced for the following reasons.

First, in a heating process, a heat stress is concentrated on a part of the wafer near the orientation flat 11 or the notch 12. As a result, crystal defects are created in the wafer, thus reducing the manufacturing yield.

Second, in a thermal oxidation process, due to the presence of the orientation flat 11 or the notch 12, the temperature is not uniform within the wafer, and also the gas stream is not uniform over the wafer. As a result, the thickness of silicon oxide layers grown on the wafer fluctuates over the wafer, thus reducing the manufacturing yield.

Third, in a chemical vapor deposition (CVD) process, due to the presence of the orientation flat 11 or the notch 12, the gas stream is not uniform over the wafer. As a result, the thickness of deposited layers fluctuates over the wafer, thus reducing the manufacturing yield.

Fourth, in a photosensitive resin coating process, the thickness of coated resin fluctuates on the wafer due to the presence of the orientation flat 11 or the notch 12, thus reducing the manufacturing yield.

Fifth, in a dry etching process, the plasma forming gas is not uniform over the wafer due to the presence of the orientation flat 11 or the notch 12. As a reult, the etching rate is not uniform within the wafer, thus reducing the manufacturing yield.

Figure 2A:
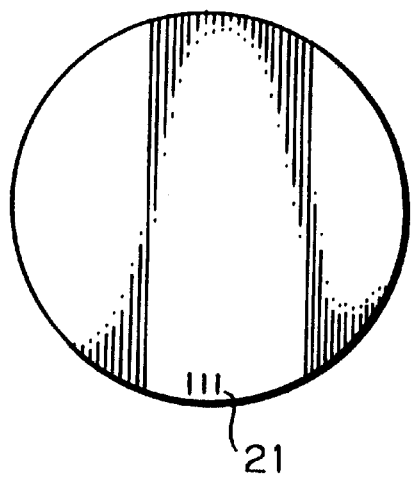
Figure 2B:
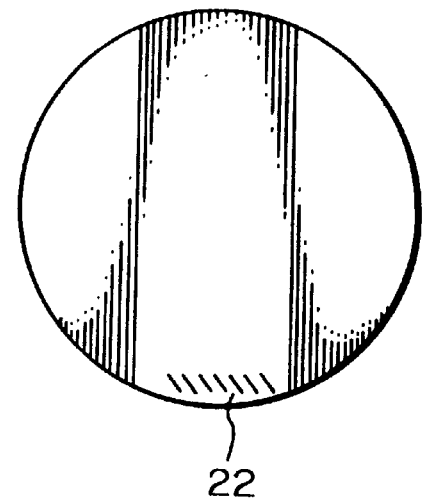
Figure 2C:
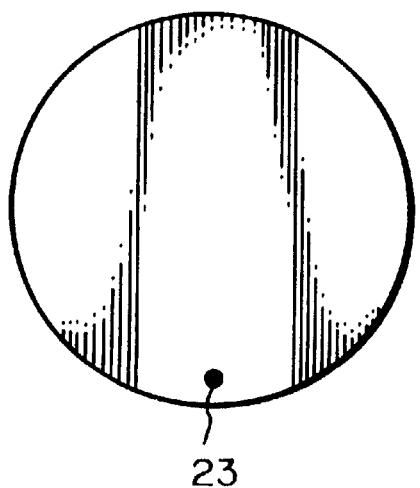
Figure 2D:
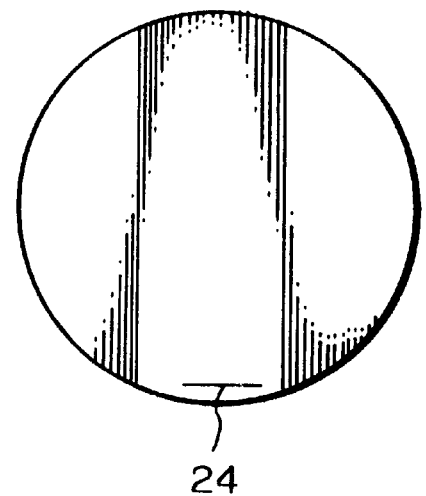

In order to increase the manufacturing yield, completely circular wafers have been adopted, and recognition marks instead of the orientation flat 11 of FIG. 1A or the notch 12 of FIG. 1B are formed by laser on the wafers. For example, as illustrated in FIG. 2A, a recognition mark 21 formed by three parallel grooves is formed by laser (see: JP-A-2-34906). Also, a recognition mark formed by a plurality of parallel lines as illustrated in FIG. 2B, a reconition mark formed by a spot as illustrated in FIG. 2C, and a recognition mark formed by a straight line as illustrated in FIG. 2D are formed by laser (see: JP-A-5-13290).

Figure 3:
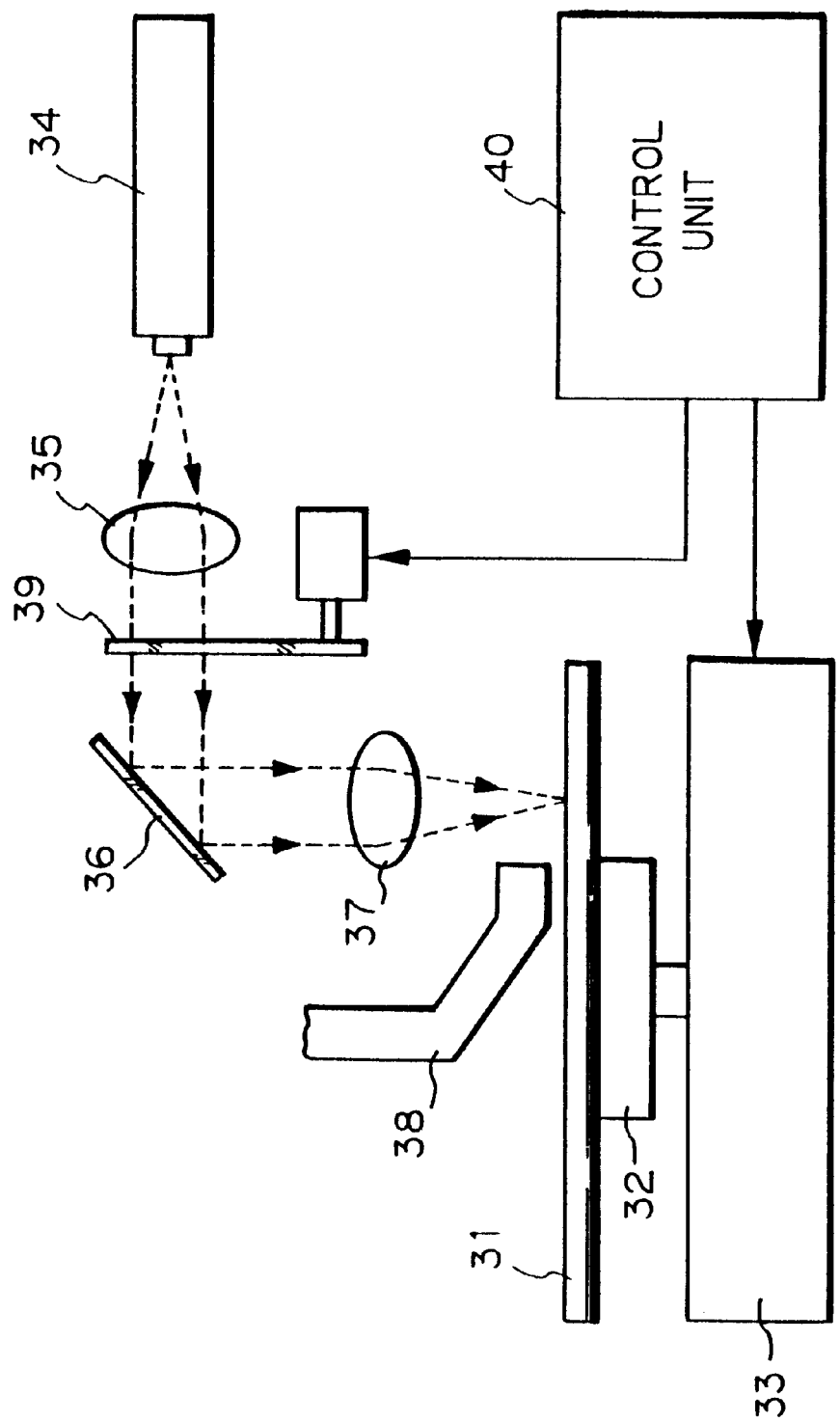
FIG. 3 is a view illustrating a prior art laser marking apparatus.

On the other hand, in FIG. 3, which illustrates a prior art laser marking apparatus, reference numeral 31 designates a wafer which is sucked to a vacuum chuck unit 32 mounted on a mounting unit 33. A laser beam generated from a laser oscillation unit 34 passes through an optical lens 35, a mirror 36 and a convergence lens 37 to reach the wafer 31, thus forming a recognition mark on the wafer 31. Note that reference numeral 38 designates an exhaust duct. Also, a shutter 39 is interposed between the optical lens 35 and the mirror 36. The mounting unit 33 and the shutter 39 are controlled by a control unit 40. That is, the mounting unit 33 is controlled by the control unit 40, so that the vacuum chuck unit 32, i.e., the wafer 31 is rotated. Also, the shutter 39 is controlled by the control unit 40, so that the laser beam is turned ON and OFF.

In a prior art method for manufacturing wafers, first, a crystal orientation of each of the wafers is determined by an X-ray diffraction method or the like. Then, each of the wafers is mounted on the laser marking apparatus of FIG. 3, thus forming a recognition mark on each of the wafers. Therefore, the number of steps required for determination of crystal orientation is remarkably increased which increases the manufacturing cost.

FIGS. 4A through 4G are views illustrating a first embodiment of the method for manufacturing wafers according to the present invention.

Figure 4A:
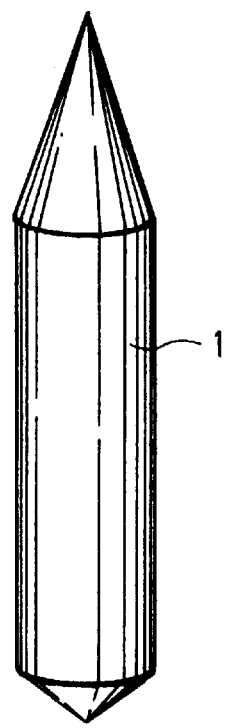
FIGS. 4A through 4G are views illustrating a first embodiment of the method for manufacturing semiconductor substrates (wafers) according to the present invention.

First, referring to FIG. 4A, a cylindrical monocrystalline silicon ingot 1 having conical ends is grown.

Figure 4B:
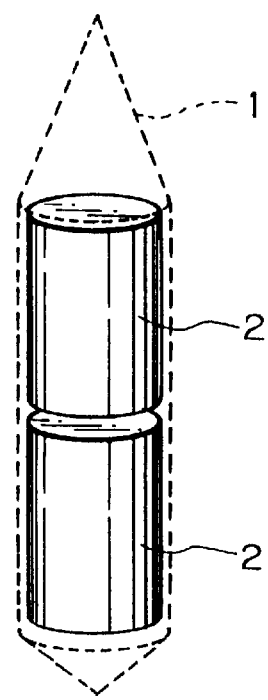

Next, referring to FIG. 4B, the monocrystalline silicon ingot 1 is cut into at least one cylindrical monocrystalline silicon member 2. In this case, the external surface of the monocrystalline silicon member 2 is ground, so that the cross section of the monocrystalline silicon member 2 is completely circular.

Figure 4C:
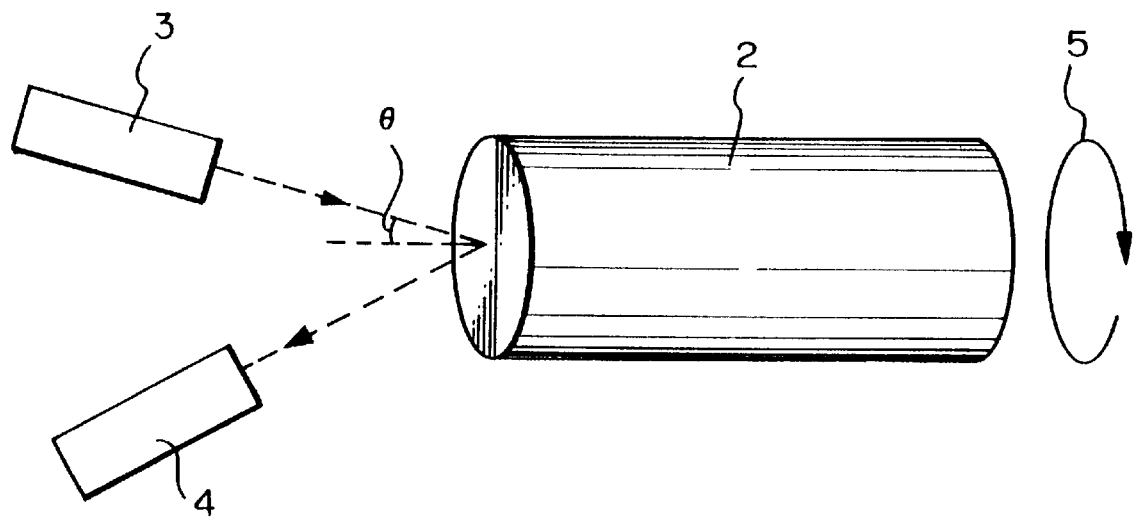

Next, referring to FIG. 4C, X-rays generated from an X-ray source 3 is irradiated onto an end surface of the nomocrystalline silicon member 2, and X-rays reflected from the monocrystalline silicon member 2 are counted by a counter 4. In this case, the monocrystalline silicon member 2 is rotated as indicated by an arrow 5, and as a result, a target crystal orientation of the monocrystalline silicon member 2 is determined by detecting a maximum value of the reflected X-rays using the Bragg condition:

$$2d \sin \theta = n\lambda$$

where d is a spacing between crystal faces of the target crystal orientation;

θ is an incident angle of the X-rays;

λ is a wavelength of the X-rays; and n is a natural number (=1, 2, . . . ).

For example, the crystal orientation <110> is effectively determined by the Bragg condition, since the diffraction strength thereof is very strong.

Figure 4D:
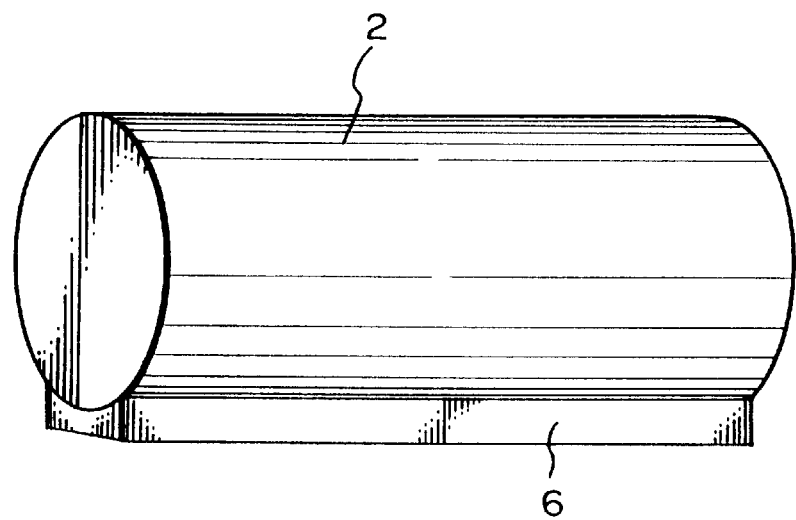

Next, referring to FIG. 4D, a support 6 made of SiC for defining the crystal orientation is adhered by an adhesive made of epoxy resin to the monocrystalline silicon member 2 in accordance with the determined crystal orientation as in FIG. 4C. In this case, an error of about ±2° can be allowed for the support 6 in relation to the monocrystalline silicon member 2.

Figure 4E:
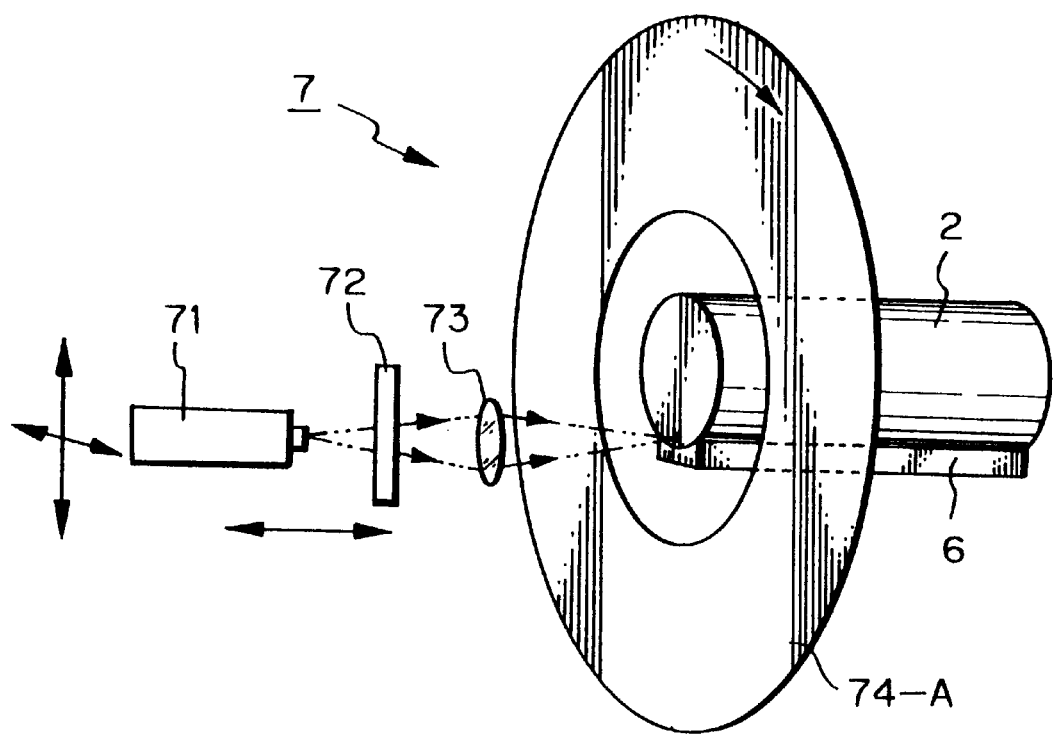

Next, referring to FIG. 4E, the monocrystalline member 2 associated with the support 6 is mounted on a laser marking/cutting apparatus 7. The laser marking/cutting apparatus 7 includes a laser oscillation unit 71, a shutter 72, an optical lens 73 and a cutter 74-A having an inner cutting edge. That is, at least one recognition mark is formed with reference to the position of the support 6 by the laser oscillation unit 71, the shutter 72 and the lens 73 which are driven as indicated by the arrows. Then, the monocrystalline silicon member 2 is cut by the cutter 74-A, so that a piece of monocrystalline silicon, i.e., a wafer 2a associated with a piece 6a of the support 6 as illustrated in FIG. 4F is obtained.

Figure 4F:
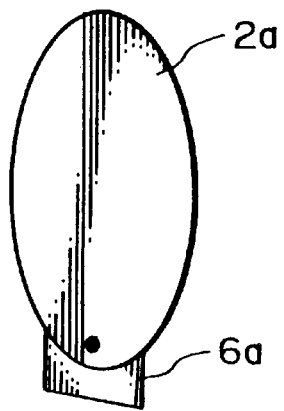
Figure 4G:
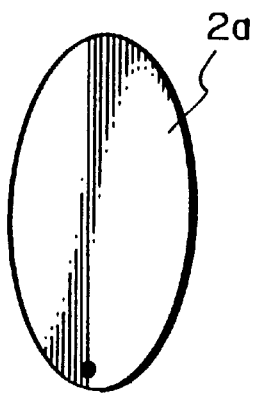

Finally, referring to FIG. 4G, the support piece 6a is separated from the wafer 2a by heating the adhesive, thus completing a completely circular wafer having a recognition mark thereon.

The operations as in FIGS. 4E, 4F and 4G are repeated to obtain a plurality of wafers from the monocrystalline silicon member 2.

Figure 5A:
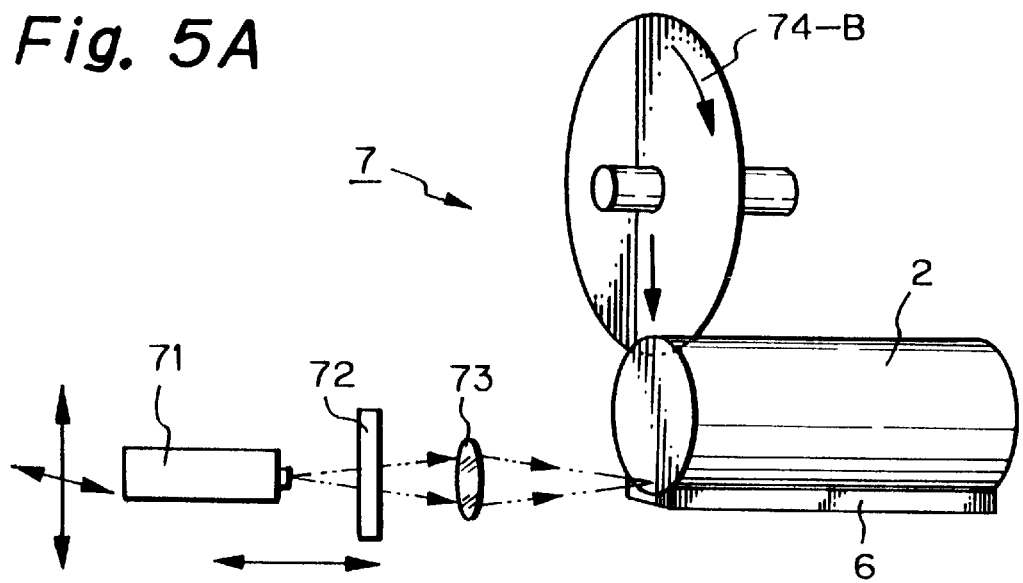
FIGS. 5A, 5B, 5C, 6A and 6B are views illustrating modifications of the laser marking/cutting apparatus of FIG. 4E.
Figure 5B:
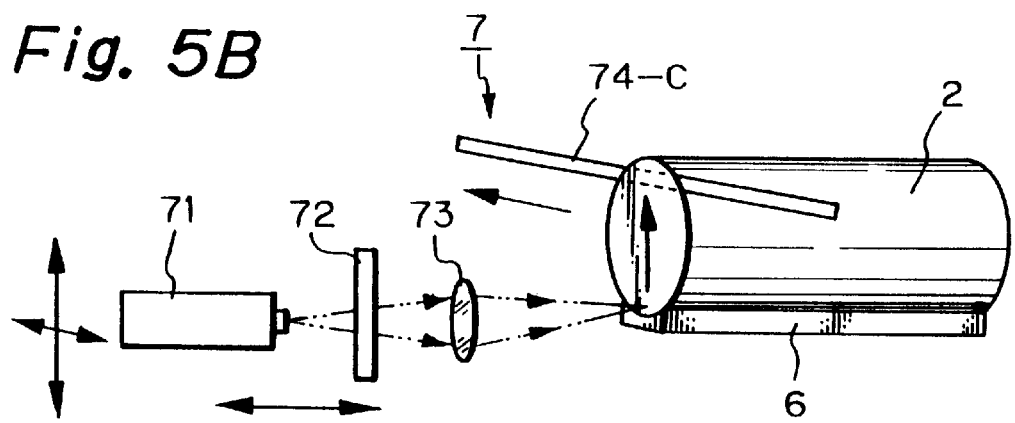
Figure 5C:
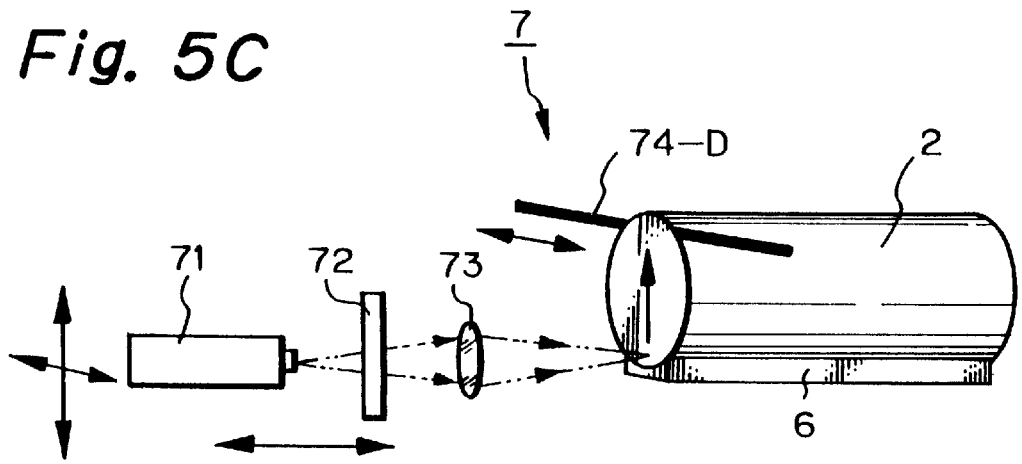

Note that, a cutter 74-B having an outer cutting edge as illustrated in FIG. 5A, a cutter 74-C formed by a band saw as illustrated in FIG. 5B, or a cutter 74-D formed by a wire saw as illustrated in FIG. 5C can be used instead of the cutter 74-A of FIG. 4E.

Figure 6A:
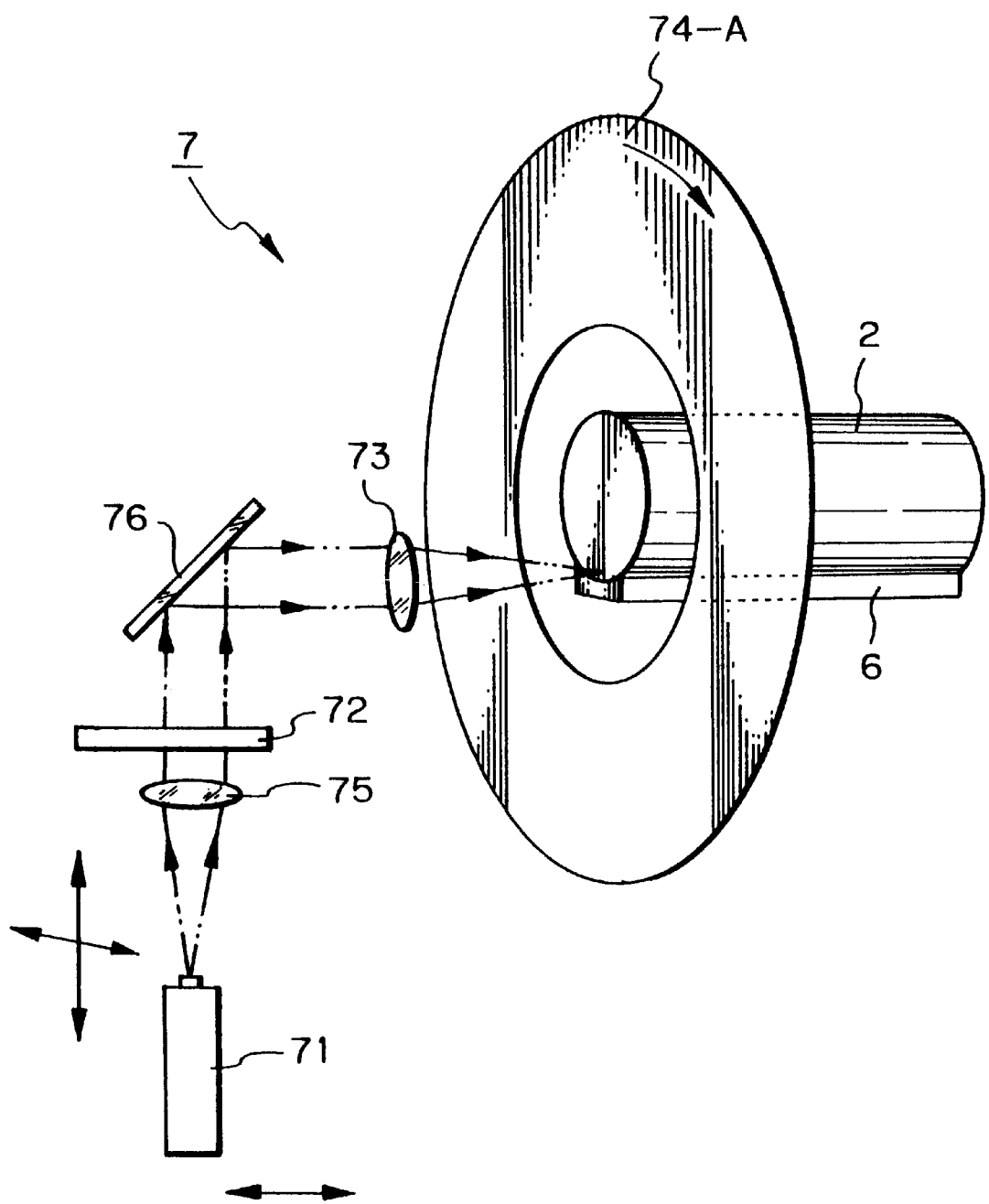

Also, as illustrated in FIG. 6A, an optical lens 75 and a mirror 76 are added to the elements of the laser marking/cutting apparatus of FIG. 4E. As a result, the length of the laser marking/cutting apparatus 7 can be reduced. In this case, the optical lens 75, the shutter 72 and the mirror 76 are driven as indicated by the arrows.

Figure 6B:
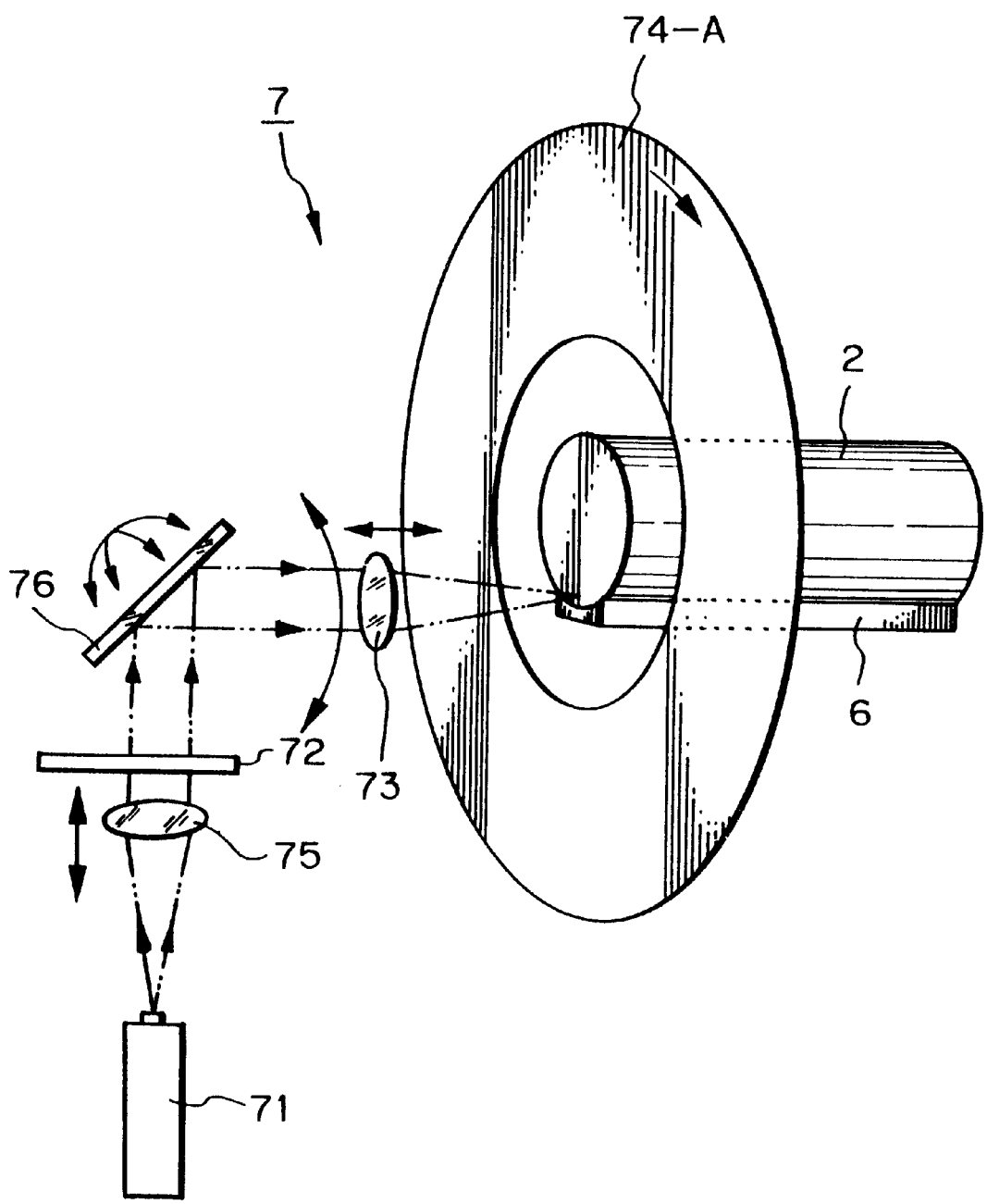

Further, as illustrated in FIG. 6B, the mirror 76 of FIG. 6A can be rotated as indicated by the arrows, and simultaneously, the optical lens 73 of FIG. 6A can also be rotated in synchronization with the mirror 76. Thus, the laser marking/cutting apparatus 7 can be reduced in size compared with those of FIGS. 4E and 6A.

Figure 7:
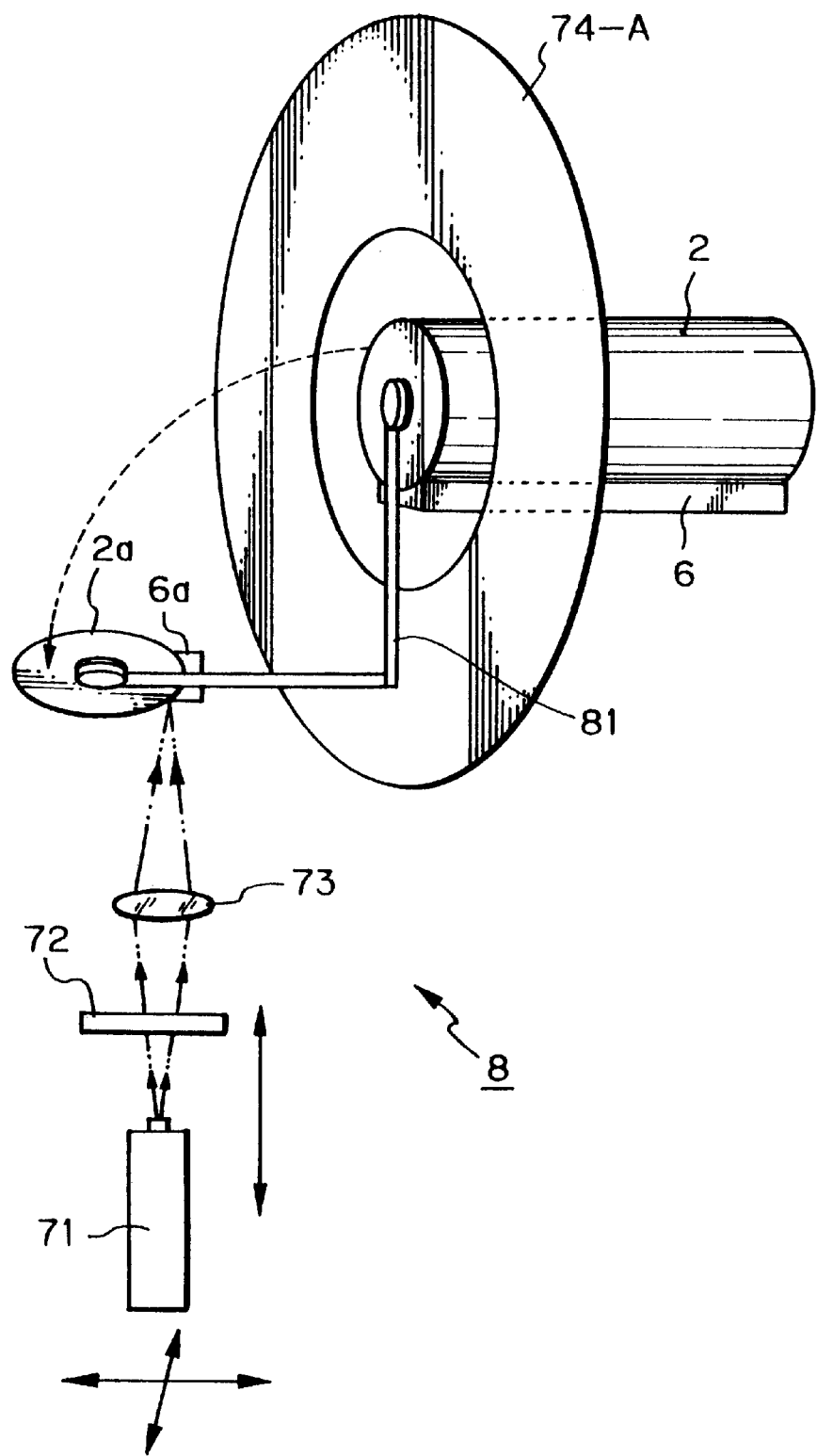
FIG. 7 is a view illustrating a second embodiment of the method for manufacturing semiconductor substrates (wafers) according to the present invention.

FIG. 7 as well as FIGS. 4A, 4B, 4C, 4D, 4F and 4G shows a second embodiment of the method for manufacturing wafers according to the present invention. That is, a step as illustrated in FIG. 7 is provided instead of the step as illustrated in FIG. 4E in the first embodiment.

That is, as illustrated in FIGS. 4A through 4D, the monocrystalline silicon member 2 is associated with the support 6 for defining the crystal orientation of the monocrystalline silicon member 2.

Next, referring to FIG. 7, the monocrystalline member 2 associated with the support 6 is mounted on a laser marking/cutting apparatus 8. The laser marking/cutting apparatus 8 includes a vacuum chuck unit 81 interposed between the optical lens 73 and the cutter 74-A of FIG. 4E. That is, the monocrystalline silicon member 2 is cut by the cutter 74-A, so that a piece of monocrystalline silicon, i.e., a wafer 2a associated with a piece 6a of the support 6 is obtained. Then, the wafer 2a associated with the support piece 6a is moved by the vacuum chuck unit 81 toward the optical lens 73. Note that the vacuum chuck unit 81 maintains the crystal orientation of the wafer 2a. Then, at least one recognition mark is formed with reference to the position of the support piece 6a by the laser oscillation unit 71, the shutter 72 and the lens 73 which are driven as indicated by arrows. Thus, the wafer 2a associated with the support piece 6a and having the recognition mark thereon as illustrated in FIG. 4F is obtained.

Finally, referring to FIG. 4G, the support piece 6a is separated from the wafer 2a by heating the adhesive, thus completing a completely circular wafer having the recognition mark thereon.

The operations as in FIGS. 7, 4F and 4G are repeated to obtain a plurality of wafers from the monocrystalline silicon member 2.

Also, note that the cutter 74-B having an outer cutting edge as illustrated in FIG. 5A, the cutter 74-C formed by a band saw as illustrated in FIG. 5B, or the cutter 74-D formed by a wire saw as illustrated in FIG. 5C can be used instead of the cutter 74-A of FIG. 7.

FIGS. 8A, 8B, 8C and 8D as well as FIG. 4A, 4B, 4C, 4D, 4F and 4G show a third embodiment of the method for manufacturing wafers according to the present invention. That is, a step as illustrated in FIGS. 8A, 8B, 8C and 8D is provided instead of the step as illustrated in FIG. 4E in the first embodiment.

That is, as illustrated in FIGS. 4A through 4D, the monocrystalline silicon member 2 is associated with the support 6 for defining the crystal orientation of the monocrystalline silicon member 2.

Figure 8A:
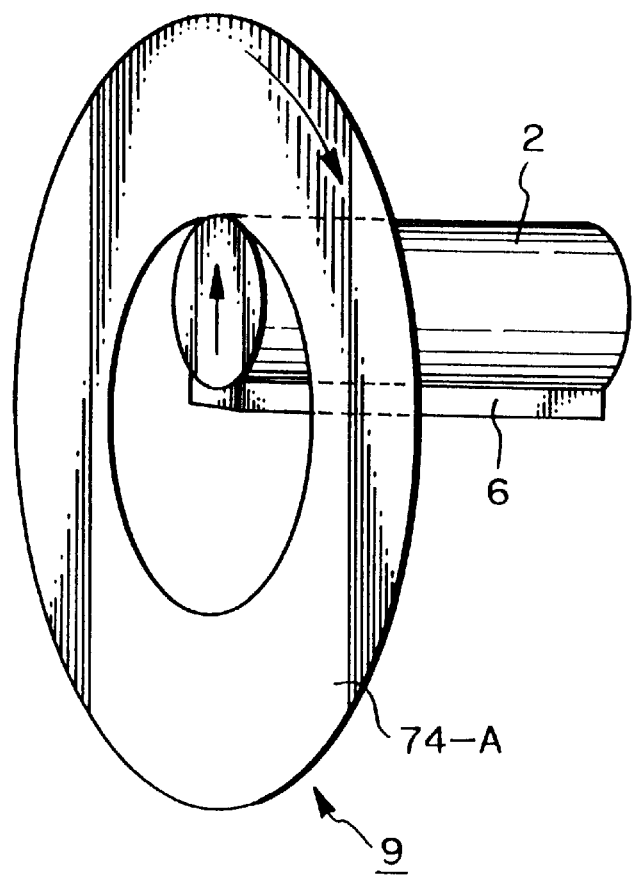
FIGS. 8A, 8B, 8C and 8D are views illustrating a third embodiment of the method for manufacturing semiconductor substrates (wafers) according to the present invention.
Figure 8B:
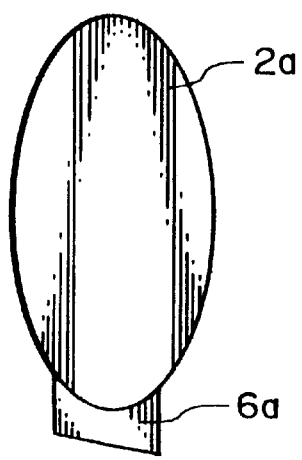

Next, referring to FIG. 8A, the monocrystalline member 2 associated with the support 6 is mounted on a cutting apparatus 9 which is formed by only a cutter 74-A having an inner cutting edge. That is, the monocrystalline silicon member 2 is cut by the cutter 74-A, so that a piece of monocrystalline silicon, i.e., a wafer 2a associated with a piece 6a of the support 6 as illustrated in FIG. 8B is obtained. In this case, note that the wafer 2a has no recognition mark thereon.

Figure 8C:
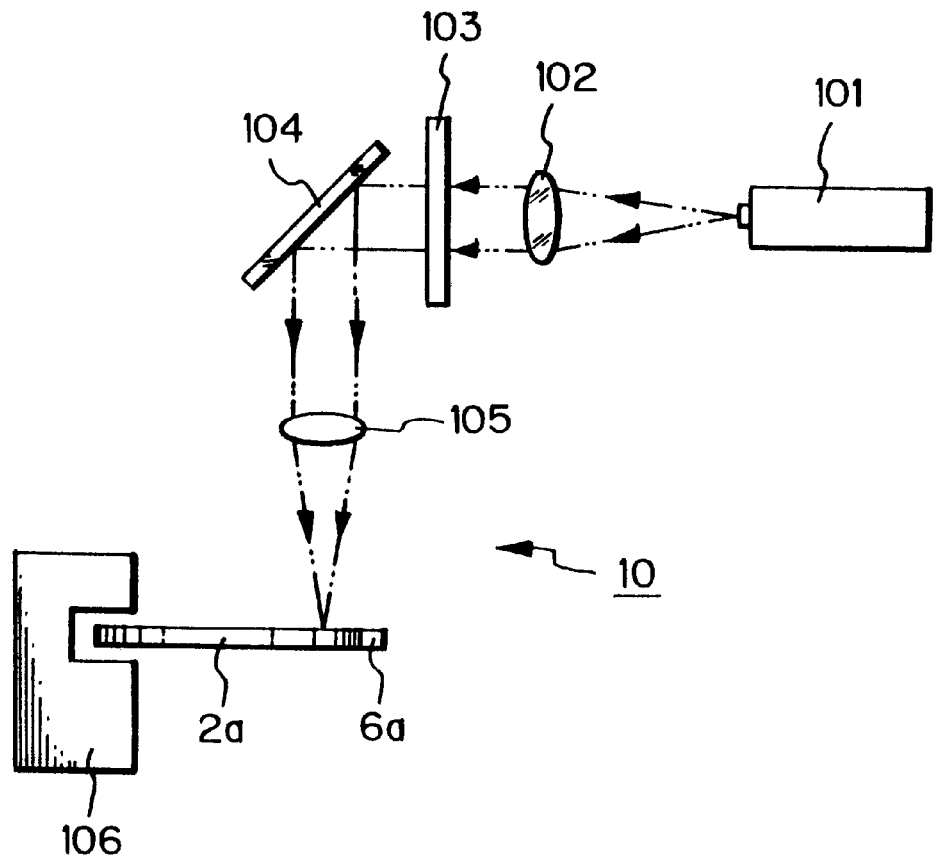
Figure 8D:
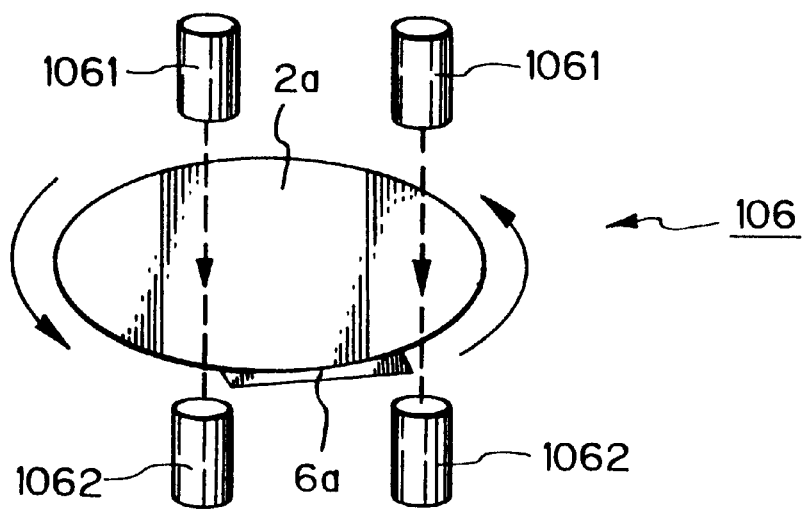

Next, referring to FIG. 8C, the wafer 2a associated with the support piece 6a is mounted on a laser marking apparatus 10. The laser marking apparatus 10 includes a laser oscillation unit 101, an optical lens 102, a shutter 103, a mirror 104, an optical lens 105, and a support piece detector 106. This support piece detector 106 is formed by light sources 1061 and light receivers 1062 as illustrated in FIG. 8D. That is, after the support piece 6a is detected by the support piece detector 106, at least one recognition mark is formed with reference to the position of the support piece 6a by the laser marking apparatus 10. Thus, the wafer 2a associated with the support piece 6a and having the recognition mark thereon as illustrated in FIG. 4F is obtained.

Finally, referring to FIG. 4G, the support piece 6a is separated from the wafer 2a by heating the adhesive, thus completing a completely circular wafer having the recognition mark thereon.

The operations as in FIGS. 8A, 8B, 8C, 8D, 4F and 4G are repeated to obtain a plurality of wafers from the monocrystalline silicon member 2.

Further, note that the cutter 74-B having an outer cutting edge as illustrated in FIG. 5A, the cutter 74-C formed by a band saw as illustrated in FIG. 5B, or the cutter 74-D formed by a wire saw as illustrated in FIG. 5C can be used instead of the cutter 74-A of FIG. 8A.

In the above-described second and third embodiments, one recognition mark is formed on each face of the wafer.

In the above-described embodiments, the recognition mark can also be used as a wafer alignment mark in a photolithography process or the like. Further, a management number can be marked simultaneously with marking of the recognition mark.

Figure 9A:
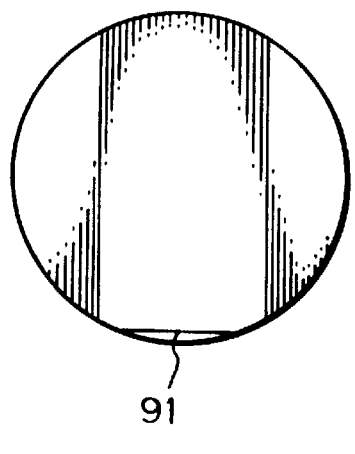
FIGS. 9A through 9E and FIGS. 10A through 10F are plan views of the wafers on which recognition marks according to the present invention are formed.
Figure 9B:
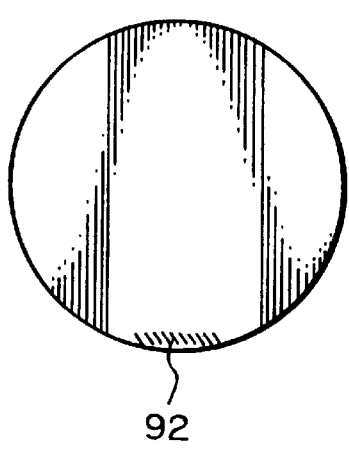
Figure 9C:
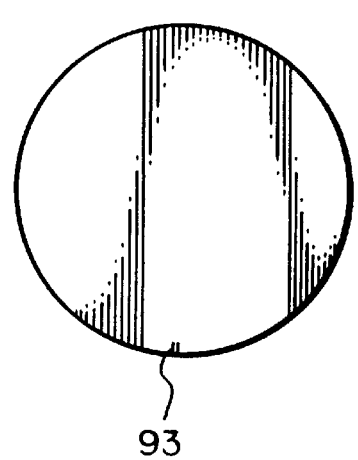
Figure 9D:
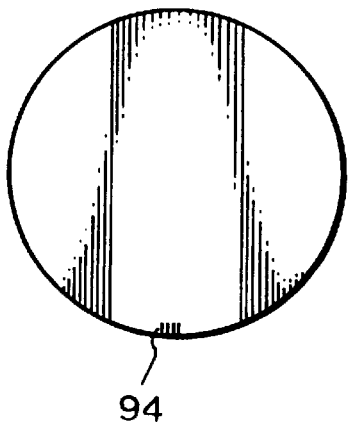
Figure 9E:
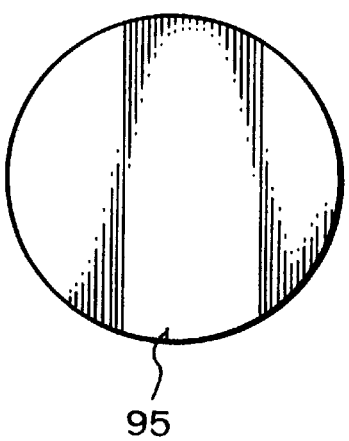

Also, various kinds of shapes of the recognition mark are possible as illustrated in FIGS. 9A, 9B, 9C, 9D and 9E. That is, the recognition mark is formed by a long line 91 as illustrated FIG. 9A, a plurality of parallel lines 92 as illustrated FIG. 9B, a spot 93 as illustrated in FIG. 9C, four parallel lines 94 as illustrated in FIG. 9D, or a short line 95 as illustrated in FIG. 9E.

Figure 10A:
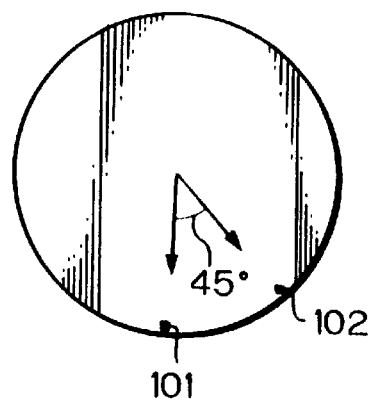
Figure 10B:
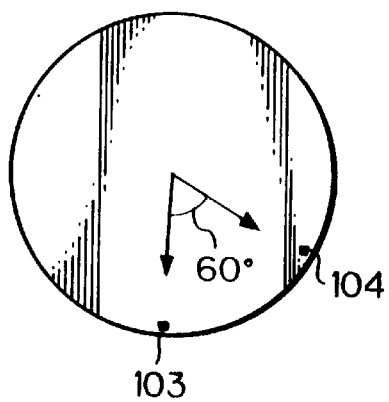
Figure 10C:
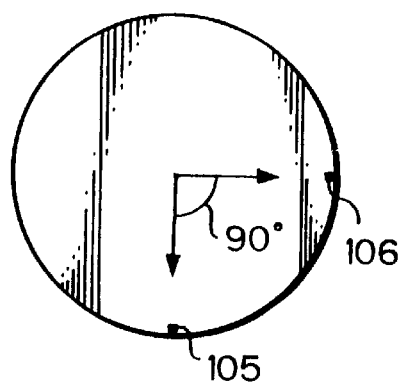
Figure 10D:
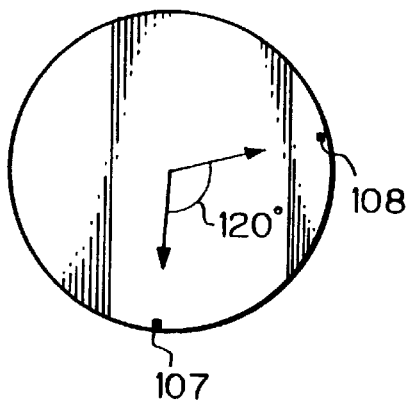
Figure 10E:
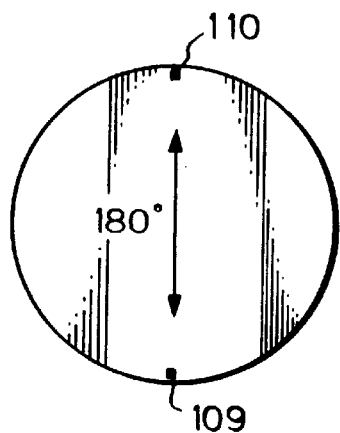
Figure 10F:
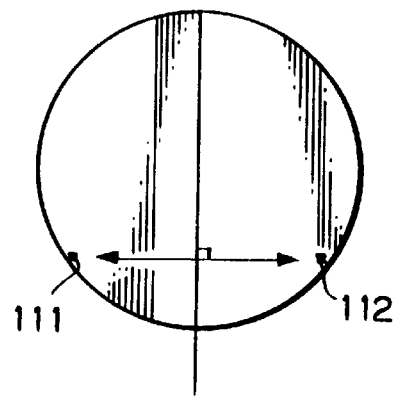

Further, the recognition mark can be at two or more positions on one wafer as illustrated in FIGS. 10A, 10B, 10C, 10D, 10E and 10F. That is, two marks 101 and 102 are at an angle of 45° with respect to a center as illustrated in FIG. 10A; two marks 103 and 104 are at an angle of 60° with respect to a center as illustrated in FIG. 10B; two marks 105 and 106 are at an angle of 90° with respect to a center as illustrated in FIG. 10C; two marks 107 and 108 are at an angle of 120° with respect to a center as illustrated in FIG. 10D; two marks 109 and 110 are at an angle of 180° with respect to a center as illustrated in FIG. 10E; and two marks 111 and 112 are symmetrical with respect to a center line as illustrated in FIG. 10F.

Further, the recongition mark formed by the laser is preferably about 50 to 200 μm in depth, since about 40 to 150 μm thickness of the wafers are etched or removed in manufacturing processes such as etching processes.

As explained hereinabove, according to the present invention, since only one determination of crystal orientation is performed upon a semiconductor crystal member such as the monocrystalline silicon member 2, the manufacturing cost of semiconductor substrates (wafers) can be remarkably reduced.

I claim:

1. An apparatus for manufacturing a plurality of completely circular semiconductor wafers from a cylindrical semiconductor crystal member, comprising:

a detecting device for detecting a specified crystal orientation of said cylindrical semiconductor crystal member;

a mounting device for mounting a support on said cylindrical semiconductor member in accordance with the specified crystal orientation thereof;

a marking and cutting device for marking a recognition mark on a top face of said cylindrical semiconductor crystal member in accordance with a position of said support and for cutting said cylindrical semiconductor crystal member marked with said recognition mark and said support to form a plurality of semiconductor wafers each attached to a separate support piece; and a separating device for separating each said semiconductor wafer from its respective support piece.

2. The apparatus as set forth in claim 1, wherein said marking and cutting device and said separating device are arranged to operate repeatedly.

3. The apparatus as set forth in claim 1, wherein said marking and cutting device comprises:

a laser marking unit; and a cutter.

4. The apparatus as set forth in claim 3, wherein said cutter has an inner cutting edge.

5. The apparatus as set forth in claim 3, wherein said cutter has an outer cutting edge.

6. The apparatus as set forth in claim 3, wherein said cutter is a band saw.

7. The apparatus as set forth in claim 3, wherein said cutter is a wire saw.

8. An apparatus for manufacturing a plurality of completely circular semiconductor wafers from a cylindrical semiconductor crystal member, comprising:

a detecting device for detecting a specified crystal orientation of said cylindrical semiconductor crystal member;

a mounting device for mounting a support on said cylindrical semiconductor member in accordance with the specified crystal orientation thereof;

a cutting and marking device for cutting said cylindrical semiconductor crystal member marked with said recognition mark and said support to form a plurality of semiconductor wavers each attached to a separate support piece and for marking a recognition mark on a face of said cylindrical semiconductor wafer in accordance with a position of said support piece; and a separating device for separating said semiconductor wafer from its respective support piece.

9. The apparatus as set forth in claim 8, wherein said cutting and marking device and said separating device are arranged to operate repeatedly.

10. The apparatus as set forth in claim 8, wherein said cutting and marking device comprises:

a laser marking unit;

a cutter; and a transporting mechanism, interposed between said laser marking unit and said cutter, for transporting said semiconductor wafer and said support piece from said cutter to said laser marking unit.

11. The apparatus as set forth in claim 10, wherein said cutter has an inner cutting edge.

12. The apparatus as set forth in claim 10, wherein said cutter has an outer cutting edge.

13. The apparatus as set forth in claim 10, wherein said cutter is a band saw.

14. The apparatus as set forth in claim 10, wherein said cutter is a wire saw.

15. An apparatus for manufacturing a plurality of completely circular semiconductor wafers from a cylindrical semiconductor crystal member, comprising:

a detection device for detecting a specified crystal orientation of said cylindrical semiconductor crystal member;

a mounting device for mounting a support on said cylindrical semiconductor member in accordance with the specified crystal orientation thereof;

a cutter for cutting said cylindrical semiconductor crystal member marked with said recognition mark and said support to form a plurality of semiconductor wafers each attached to a separate support piece;

a mark making unit for marking a recognition mark on a face of said cylindrical semiconductor wafer in accordance with a position of said support piece; and a separating device for separating said semiconductor wafer from its respective support piece.

16. The apparatus as set forth in claim 15, wherein said cutter, said unit and said separating device are arranged to operate repeatedly.

17. The apparatus as set forth in claim 16, wherein said cutter has an inner cutting edge.

18. The apparatus as set forth in claim 16, wherein said cutter has an outer cutting edge.

19. The apparatus as set forth in claim 16, wherein said cutter is a band saw.

20. The apparatus as set forth in claim 16, wherein said cutter is a wire saw.

21. The apparatus as set forth in claim 15, wherein mark marking unit comprises:

a laser marking unit; and a support piece detector.

22. An apparatus for manufacturing a plurality of completely circular semiconductor wafers from a cylindrical semiconductor crystal member, comprising:

a detector for detecting a specified crystal orientation of said cylindrical semiconductor crystal member;

a mounting device for mounting a support on said cylindrical semiconductor member in accordance with the specified crystal orientation thereof;

a cutting and marking device for cutting said cylindrical semiconductor crystal member marked with said recognition mark and said support to form a semiconductor wafer attached to a support piece and for marking a recognition mark on a face of said cylindrical semiconductor wafer in accordance with a position of said support piece, said cutting and marking means comprising a laser marking unit; a cutter; and a transporting mechanism, interposed between said laser marking unit and said cutter, for transporting said semiconductor wafer and its respective support piece from said cutter to said laser marking unit.

23. The apparatus as set forth in claim 22, wherein said cutting and marking device and said separating device are arranged to operate repeatedly.

24. The apparatus as set forth in claim 22, wherein said cutter has an inner cutting edge.

25. The apparatus as set forth in claim 22, wherein said cutter has an outer cutting edge.

26. The apparatus as set forth in claim 22, wherein said cutter is a band saw.

27. The apparatus as set forth in claim 22, wherein said cutter is a wire saw.

* * * * *